US010527652B2

(12) United States Patent
Magoni et al.

(10) Patent No.: US 10,527,652 B2
(45) Date of Patent: Jan. 7, 2020

(54) ACCESSORY DEVICE FOR DETECTING CURRENT FLOW IN AN ELECTRIC CABLE

(71) Applicant: ABB Schweiz AG, Baden (CH)

(72) Inventors: Stefano Magoni, Osio Sotto (IT); Giorgio Magno, Brembate di Sopra (IT); Massimo Scarpellini, Dalmine (IT)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 15/742,570

(22) PCT Filed: Jun. 16, 2016

(86) PCT No.: PCT/EP2016/063944
§ 371 (c)(1),
(2) Date: Jan. 8, 2018

(87) PCT Pub. No.: WO2017/005473
PCT Pub. Date: Jan. 12, 2017

(65) Prior Publication Data
US 2018/0203044 A1    Jul. 19, 2018

(30) Foreign Application Priority Data

Jul. 6, 2015   (EP) ................................. 15175498

(51) Int. Cl.
*G01R 15/20* (2006.01)
*G01R 19/00* (2006.01)

(52) U.S. Cl.
CPC ......... *G01R 15/207* (2013.01); *G01R 15/202* (2013.01); *G01R 19/0092* (2013.01)

(58) Field of Classification Search
CPC ............. G01R 19/0092; G01R 15/202; G01R 15/183; G01R 33/07; G01R 15/146;
(Continued)

(56) References Cited

U.S. PATENT DOCUMENTS 5,426,360 A * 6/1995 Maraio ................ G01R 15/142
                                                324/126
8,917,085 B2 * 12/2014 Hashio ............... G01R 1/06788
                                                174/59
(Continued)

FOREIGN PATENT DOCUMENTS

DE    202008012593 U1   12/2008
WO      2007068221 A1    6/2007

OTHER PUBLICATIONS

European Patent Office, International Search Report & Written Opinion issued in corresponding Application No. PCT/EP2016/063944, dated Sep. 13, 2016, 11 pp.
(Continued)

*Primary Examiner* — Vinh P Nguyen
(74) *Attorney, Agent, or Firm* — Taft Stettinius & Hollister LLP; J. Bruce Schelkopf

(57) ABSTRACT

An accessory device for low or medium voltage electric applications includes a casing and electronic means including one or more current sensors for detecting current flowing in an electric cable. The top shell of the casing includes an external recess having a cable seat for accommodating the electric cable in a transversal position with respect to the casing. The cable seat has a cable coupling surface adapted to mechanically couple with the electrical cable. The accessory device includes a holder element mechanically coupleable with the top shell in the external recess. The holder element includes one or more holding surfaces. Each of the holding surfaces is overlapped and mechanically coupled with the electric cable, when the holder element is positioned in the external recess in a corresponding accommodating position that is selectable depending on the size of the electric cable. Each of the holding surfaces, when overlapped and coupled with the electric cable, cooperates with
(Continued)

the cable coupling surface to hold the electric cable in a given position with respect to the current sensors.

19 Claims, 13 Drawing Sheets

(58) Field of Classification Search
CPC ............ G01R 19/0084; G01R 19/2513; G01R 33/09; G01R 15/08; G01R 15/18; G01R 1/04; G01R 19/15; G01R 31/42; G01R 15/144; G01R 19/00; G01R 21/06; G01R 33/075; G01R 15/148; G01R 15/16; G01R 1/20; G01R 33/0005; G01R 33/0017; G01R 33/18; H01L 43/04; H01L 43/065; H01R 13/6683; H01R 2201/20; H01R 12/53; H01R 12/73; H01R 13/745; H01R 4/023; H02J 7/025
See application file for complete search history.

(56) References Cited

U.S. PATENT DOCUMENTS

| | | |
|---|---|---|
| 2010/0237853 A1 | 9/2010 | Bose et al. |
| 2010/0315066 A1 | 12/2010 | Hashio et al. |
| 2014/0083993 A1* | 3/2014 | Maier .................... F24C 7/087 |
| | | 219/446.1 |
| 2014/0184212 A1* | 7/2014 | Yamaguchi .......... G01R 15/207 |
| | | 324/244 |

OTHER PUBLICATIONS

European Patent Office, Extended Search Report issued in corresponding Application No. 15175498.3, dated Jan. 12, 2016, 7 pp.

* cited by examiner

ACCESSORY DEVICE FOR DETECTING CURRENT FLOW IN AN ELECTRIC CABLE

The present invention relates the field of low or medium voltage electric power distribution networks.

More particularly, the present invention relates to an accessory device for monitoring and diagnostic (M&D) purposes, which is suitable for use in low or medium voltage electric equipment.

For the purposes of the present application, the term "low voltage" (LV) relates to voltages lower than 1 kV AC and 1.5 kV DC whereas the term "medium voltage" (MV) relates to voltages higher than 1 kV AC and 1.5 kV DC up to some tens of kV, e.g. 72 kV AC and 100 kV DC.

As is known, in the field of electric power distribution networks, accessory devices are adopted to manage the operating life of electric power equipment, such as switchboards, switching devices (e.g. a circuit breakers, disconnectors, sectionalizers, contactors, reclosers), and the like.

These accessory devices are generally aimed at improving or extending the overall functionalities of the electric power equipment in which they are comprised.

Some accessory devices, which are also defined as monitoring and diagnostic (M&D) devices, are configured to perform monitoring and diagnostic functions of some electrical quantities (typically voltages or currents) at some points of the electric power equipment in which they are included.

In the state of the art, there are M&D devices specifically dedicated to perform monitoring and diagnostic functions of an electric current flowing along an electric cable.

Typically, an accessory device of this kind comprises one or more current sensors (e.g. Hall sensors) configured to perform a proximity detection of a current flowing in the electric cable. The electric cable is mechanically coupled with the external casing of the accessory device so as to be in a given relative position with respect to the current sensors.

In such traditional accessory devices, it may be difficult to obtain a good fitting between the electric cable and the external casing, as the electric cable is generally hold in position by means of plastic strips and cable ties.

This solution, in fact, does not ensure a stable positioning of the electric cable relative to the current sensors, particularly when the installation volumes are relatively small.

Such a criticality is further increased by the fact that electric cables may have different sizes (e.g. different external diameters), which may make difficult their fitting with an accessory device having a standardized casing.

The experience has shown that the above technical problems may be at the origin of remarkable errors (even higher than 5%) in the current measurements performed by the accessory device.

Such measurement errors are even more critical as they are difficult to identify and compensate given the fact they are basically due to an unstable coupling between the electric cable and the casing of the accessory device.

In the market, it is felt the demand for technical solutions capable of solving, at least partially, the drawbacks mentioned above.

In order to respond to this need, the present invention provides an accessory device for LV or MV electric power equipment, according to the following claim 1 and the related dependent claims.

In a general definition, the accessory device, according to the invention, comprises a casing having a top shell and a bottom shell that are mechanically coupleable one to another to form a shaped box body defining an internal volume of the casing.

The accessory device, according to the invention, comprises electronic means within the internal volume of the casing and including one or more current sensors configured to detect a current flowing in an electric cable.

The top shell of the casing comprises an external recess having a bottom wall, first lateral walls opposite one to another and second lateral walls opposite one to another.

Said bottom wall and said first lateral walls are shaped so as to define a cable seat for accommodating the electric cable in a transversal position with respect to said first lateral walls and in proximity of the current sensors.

The cable seat has a cable coupling surface adapted to mechanically couple with the electrical cable.

The accessory device, according to the invention, further comprises a holder element mechanically coupleable with the top shell in the external recess.

The holder element comprises one or more holding surfaces.

Each holding surface is overlapped and mechanically coupled with the electric cable, when the holder element is positioned in the external recess in a corresponding accommodating position that is selectable depending on the size of the electric cable.

Each holding surface, when overlapped and coupled with the electric cable, cooperates with the cable coupling surface of the cable seat to hold the electric cable in a given relative position with respect to the current sensors.

According to an aspect of the invention, the holder element comprises a plurality of holding surfaces.

According to an aspect of the invention, the holder element comprises a first holding surface that is coupled with the electric cable when the holder element is positioned in the external recess in a first accommodating position corresponding to a first size of the electric cable.

According to an aspect of the invention, the holder element comprises a second holding surface that is coupled with the electric cable when the holder element is positioned in the external recess in a second accommodating position corresponding to a second size of the electric cable.

According to an aspect of the invention, the holder element comprises a third holding surface that is coupled with the electric cable when the holder element is positioned in the external recess in a third accommodating position corresponding to a third size of the electric cable.

According to an aspect of the invention, the holder element comprises a fourth holding surface that is coupled with the electric cable when the holder element is positioned in the external recess in a fourth accommodating position corresponding to a fourth size of the electric cable.

In a further aspect, the present invention relates to LV or MV electric power equipment, according to the following claim 16.

Further characteristics and advantages of the present invention shall emerge more clearly from the description of preferred but not exclusive embodiments illustrated purely by way of example and without limitation in the attached drawings, in which.

With reference to the mentioned figures, the present invention relates to an accessory device 1 for M&D purposes.

The accessory device 1 is a M&D device particularly suitable for use in LV or MV electric equipment, such as LV or MV switchboards, switching devices (e.g. circuit breakers, disconnectors, sectionalizers, contactors, reclosers), and the like.

As an example, the accessory device 1 may be used to detect the electric current feeding a spring charging electric motor of MV switchgear.

The accessory device 1 comprises a casing 2, which comprises a top shell 3 and a bottom shell 4.

Figure 13:
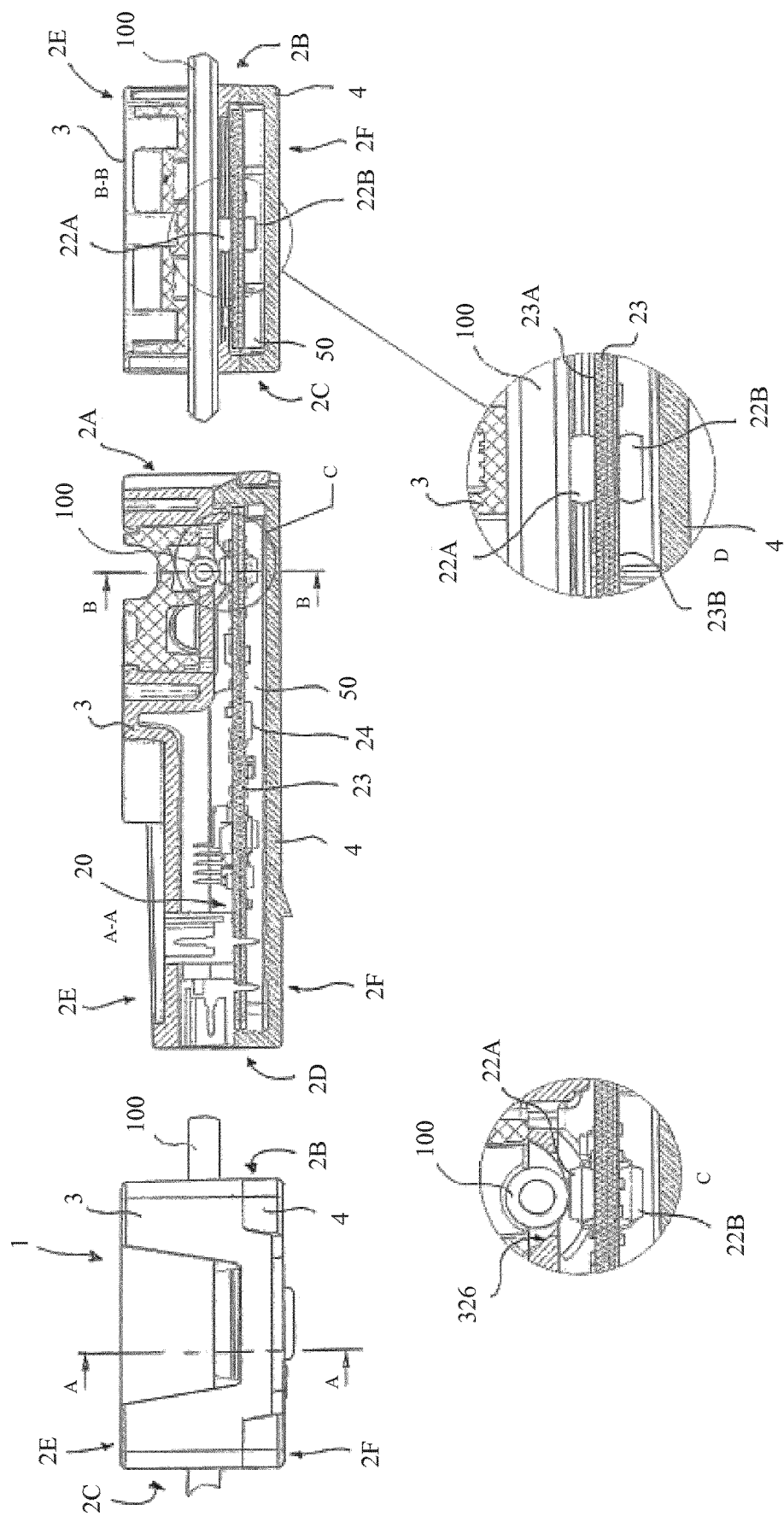
FIG. 13 shows some further particulars of the accessory device of FIGS. 1-3, when it is fit with an electric cable.

The top shell 3 and the bottom shell 4 are mechanically coupleable one to another to form a shaped box body defining an internal volume 50 of the casing 2 (FIG. 13).

Preferably, the casing 2 comprises first and fourth sides 2A, 2D opposite one to another second and third sides 2B, 2C opposite one to another.

Figure 1:
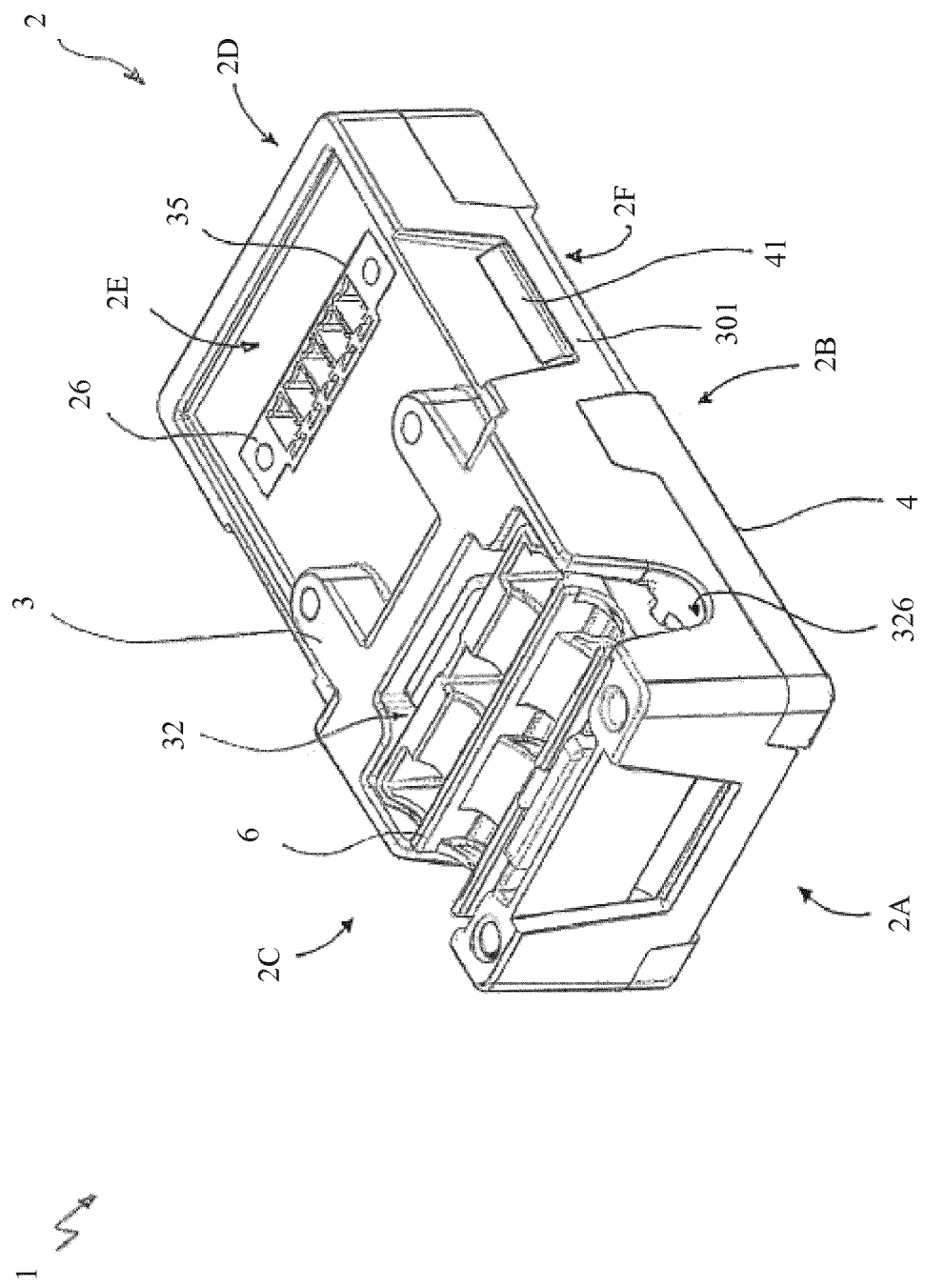
FIGS. 1-4 show different views of an embodiment of the accessory device, according to the invention.
Figure 2:
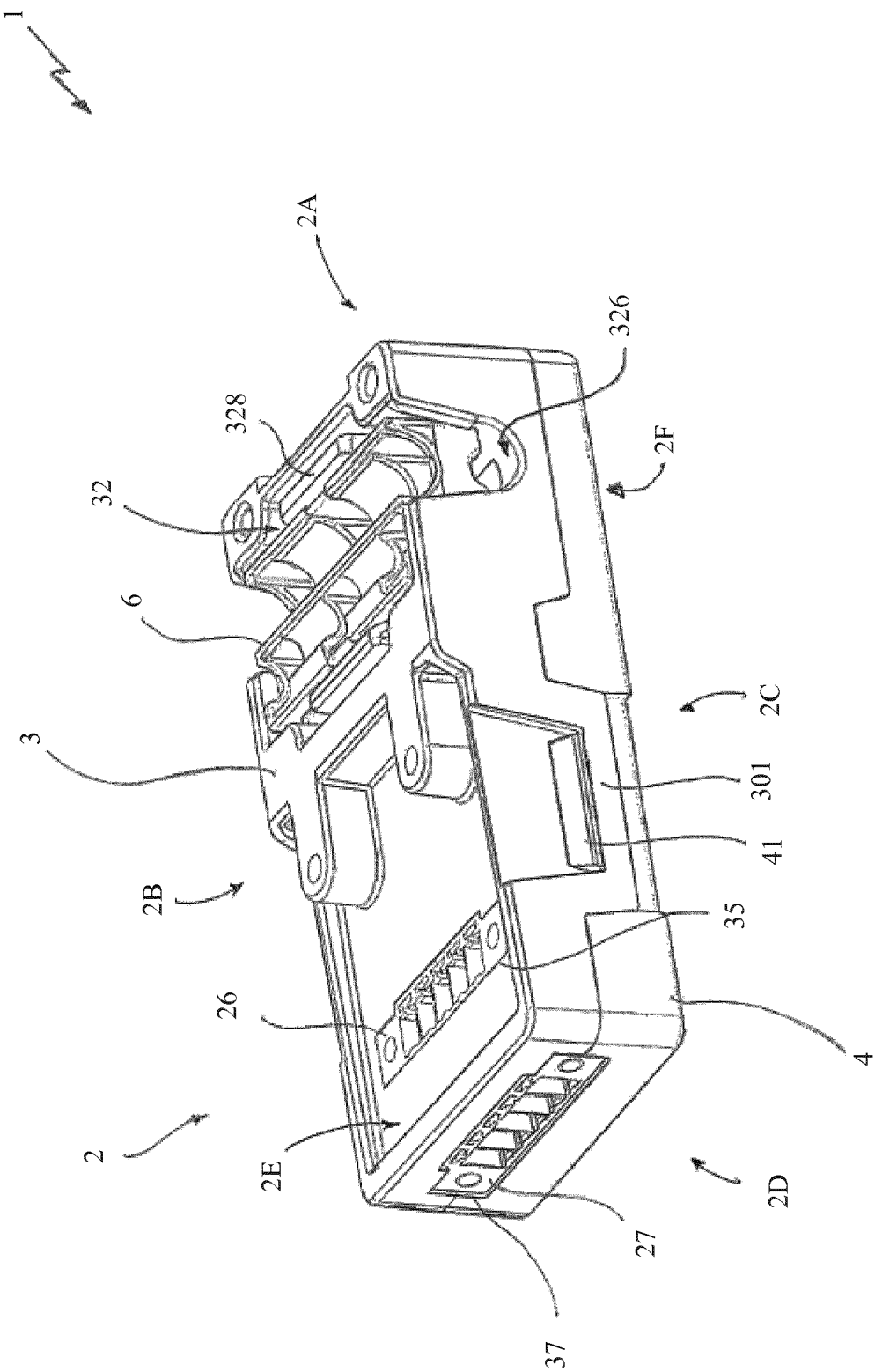
Figure 3:
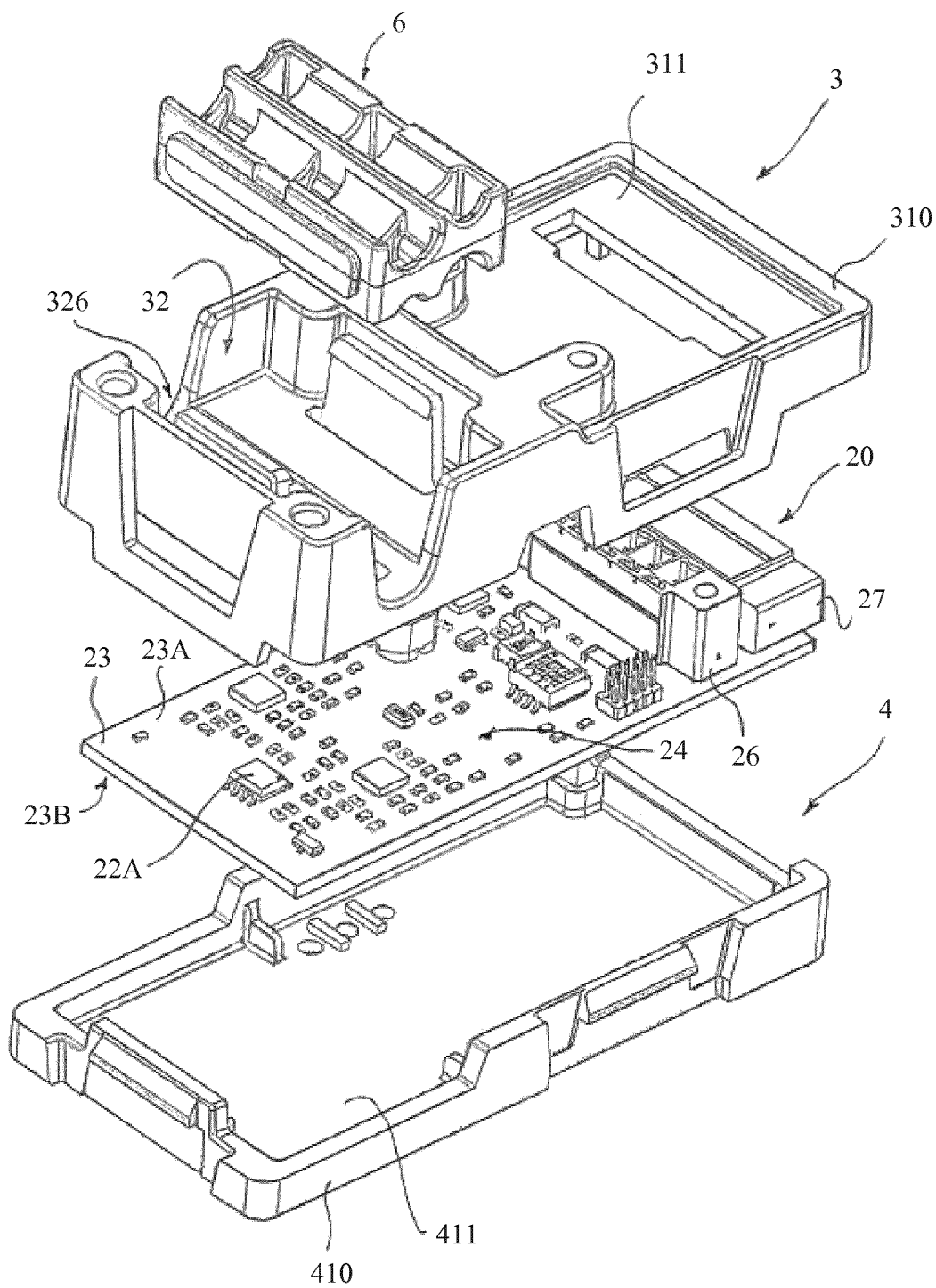
Figure 4:
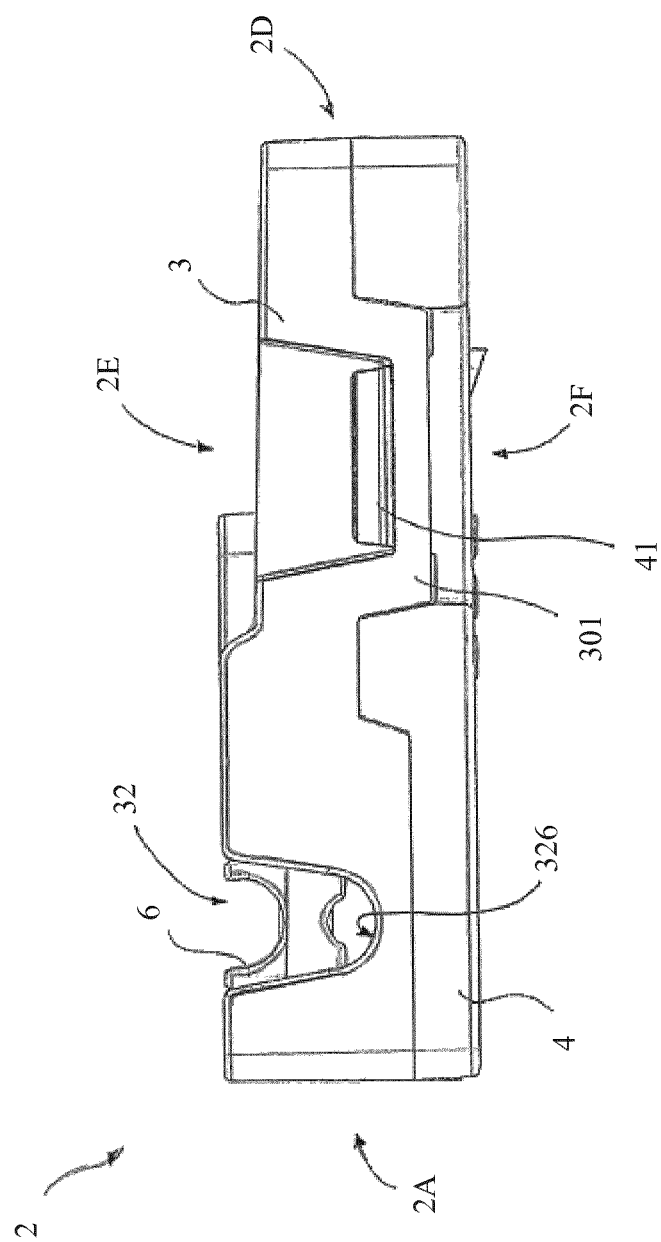
Figure 5:
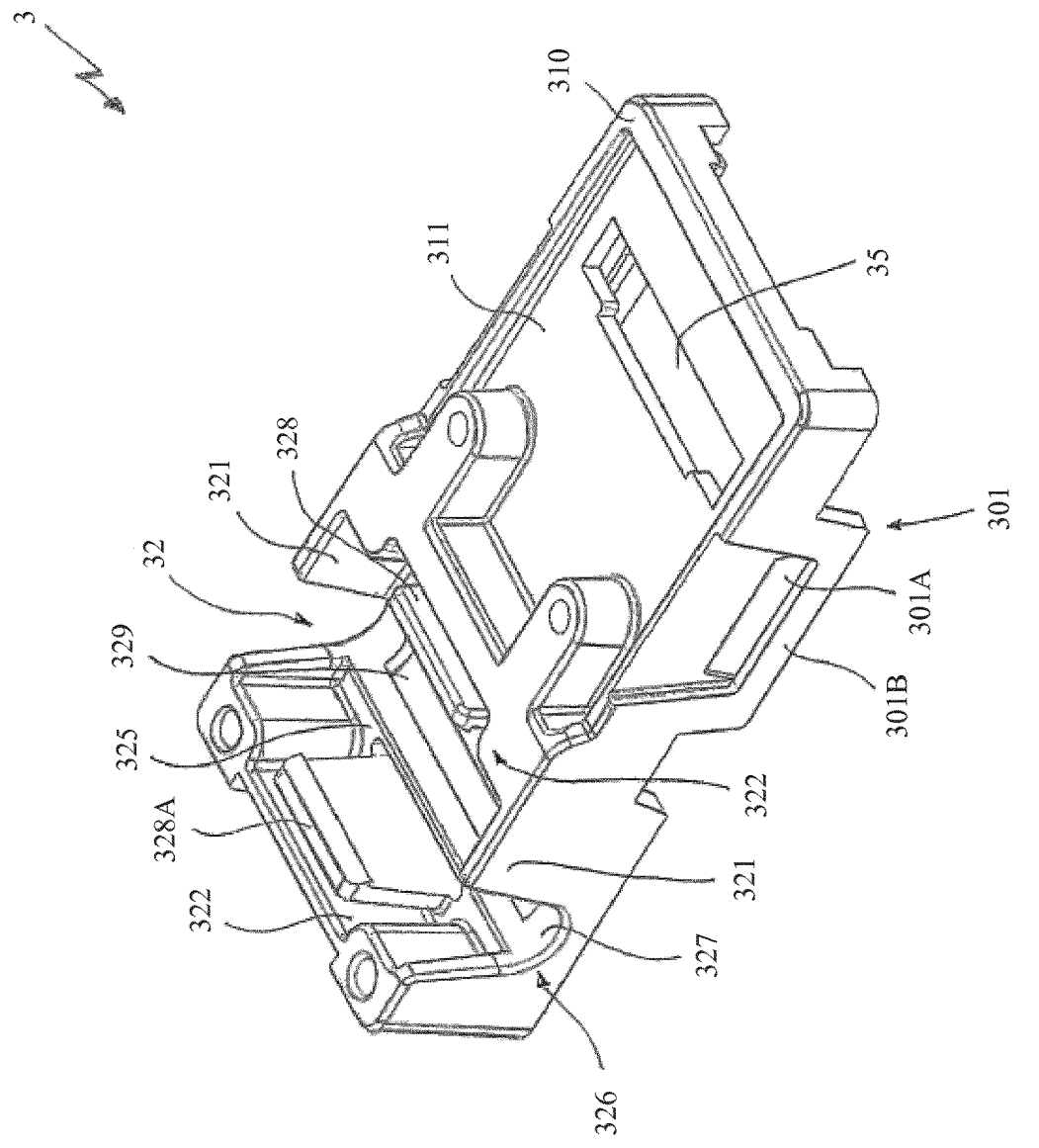
FIGS. 5-7 show different views of the top shell of the accessory device of FIGS. 1-3.
Figure 6:
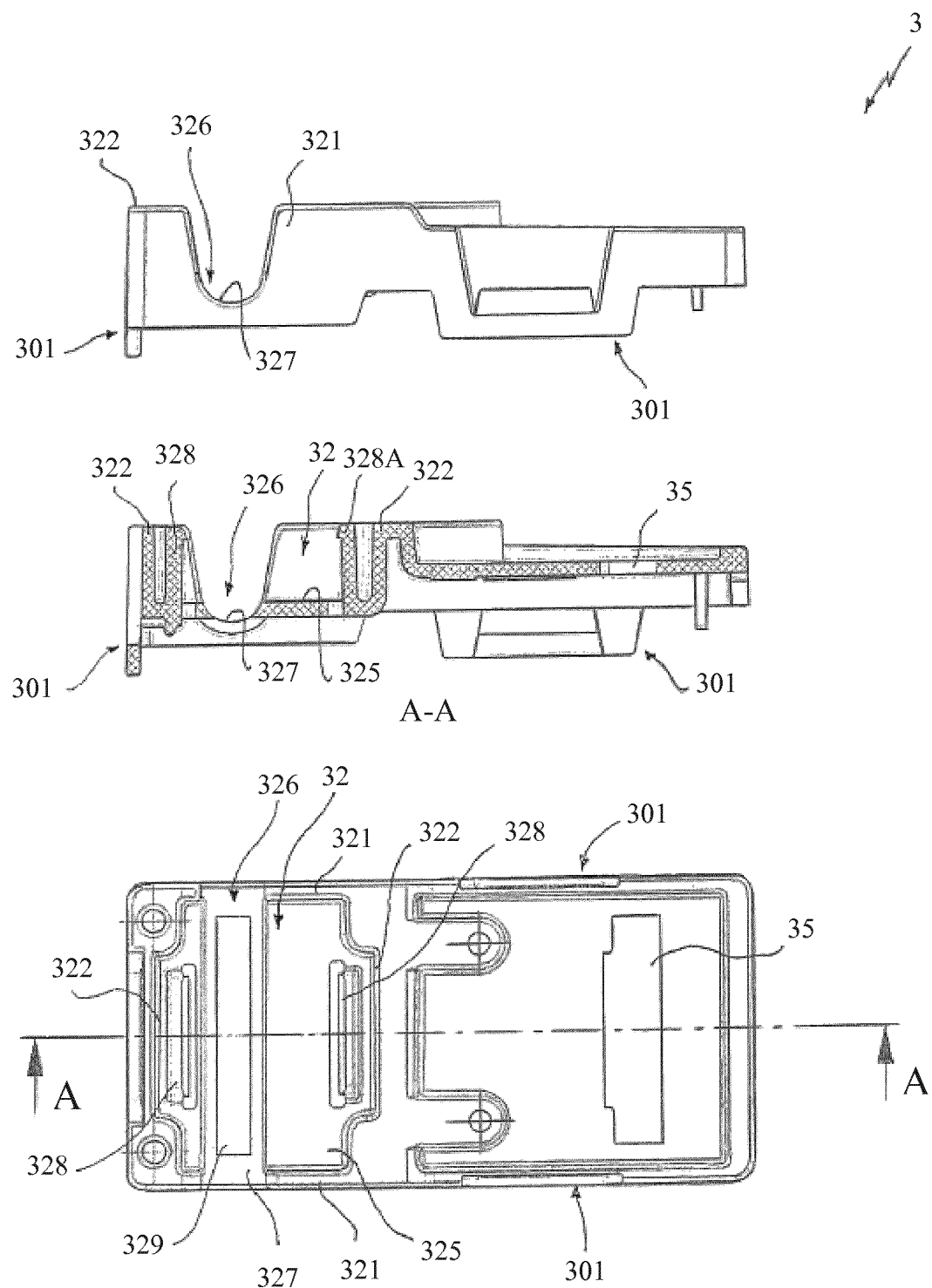
Figure 7:
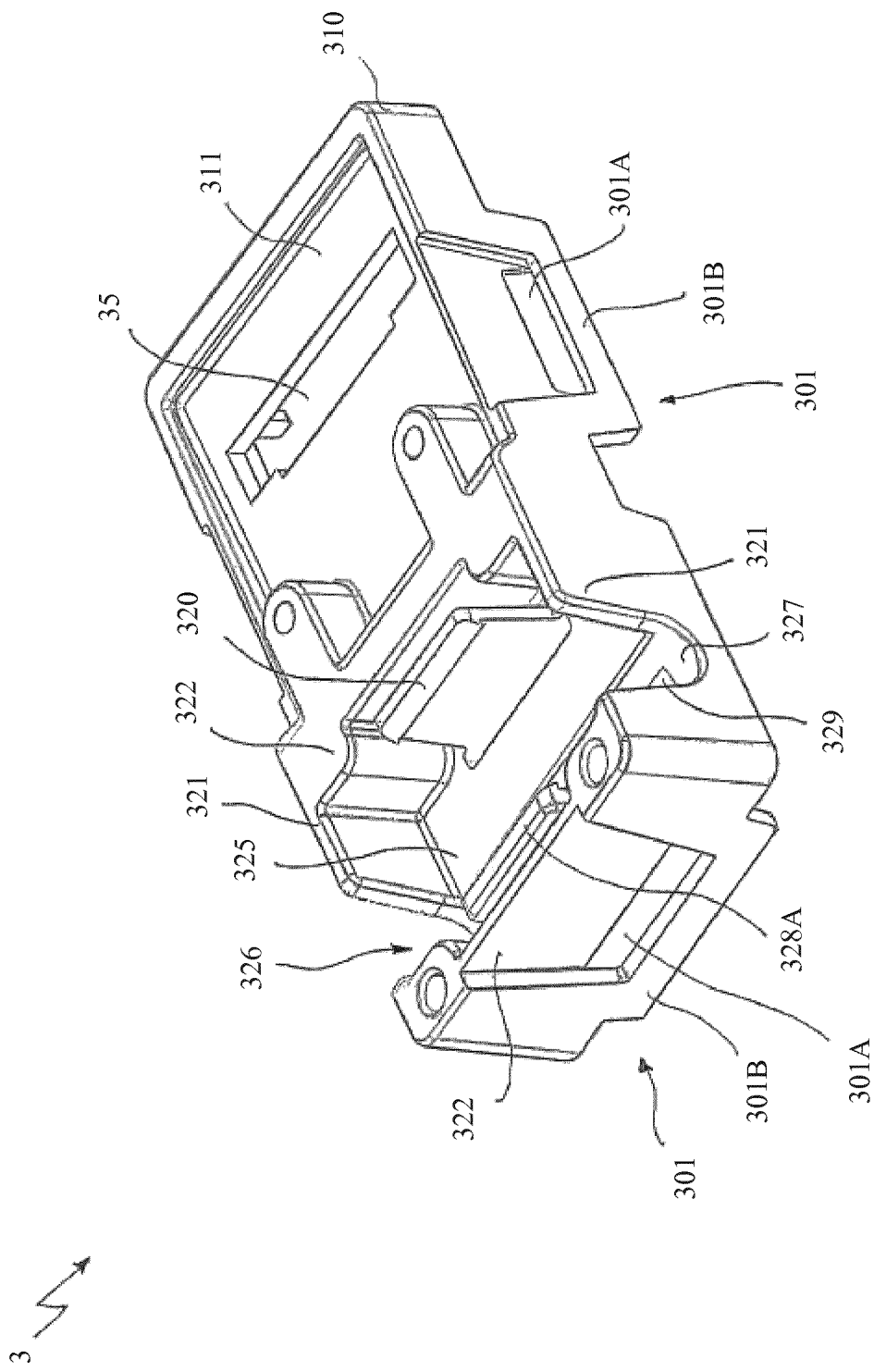
Figure 8:
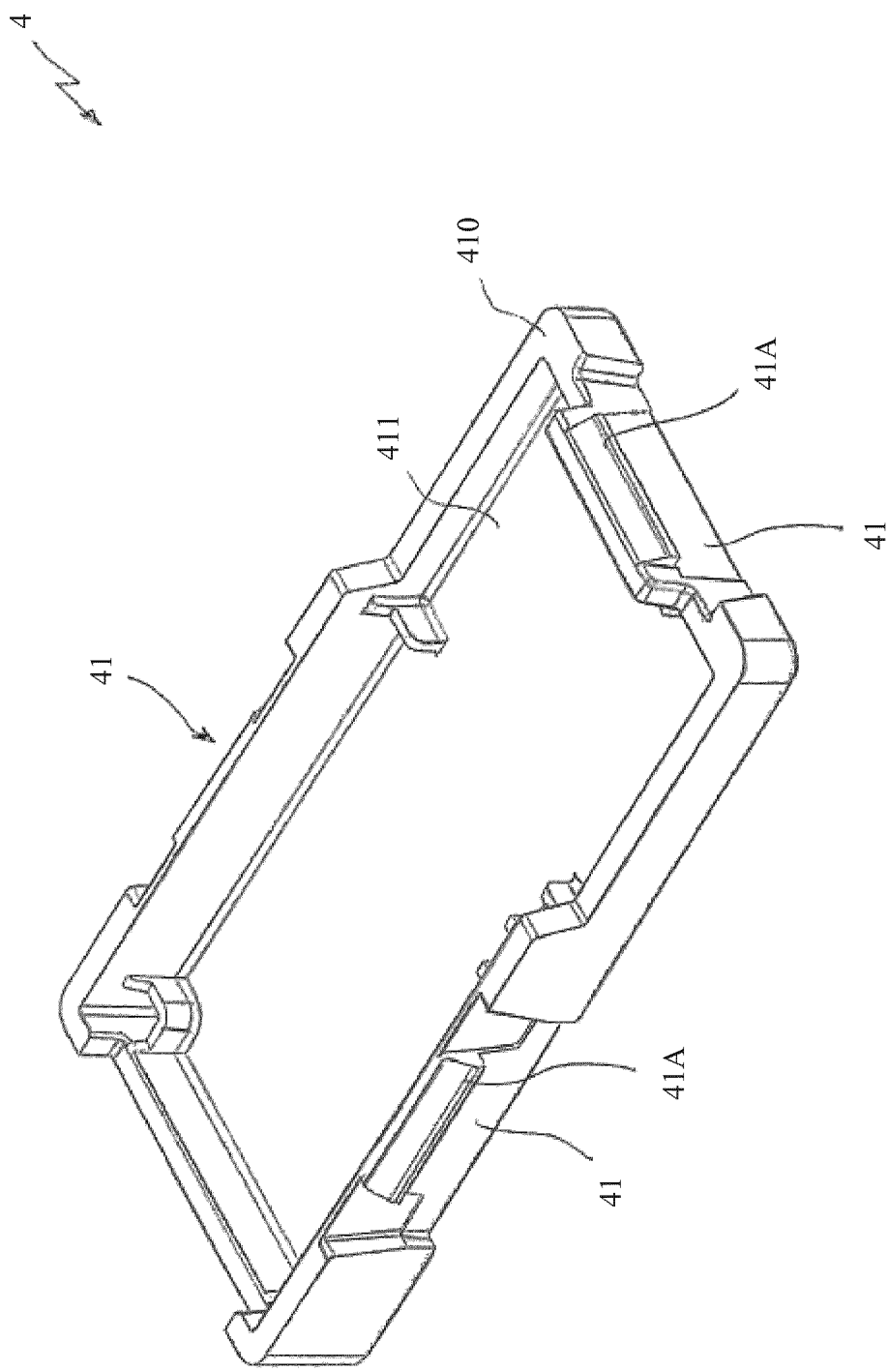
FIGS. 8-9 show different views of the bottom shell of the accessory device of FIGS. 1-3.
Figure 9:
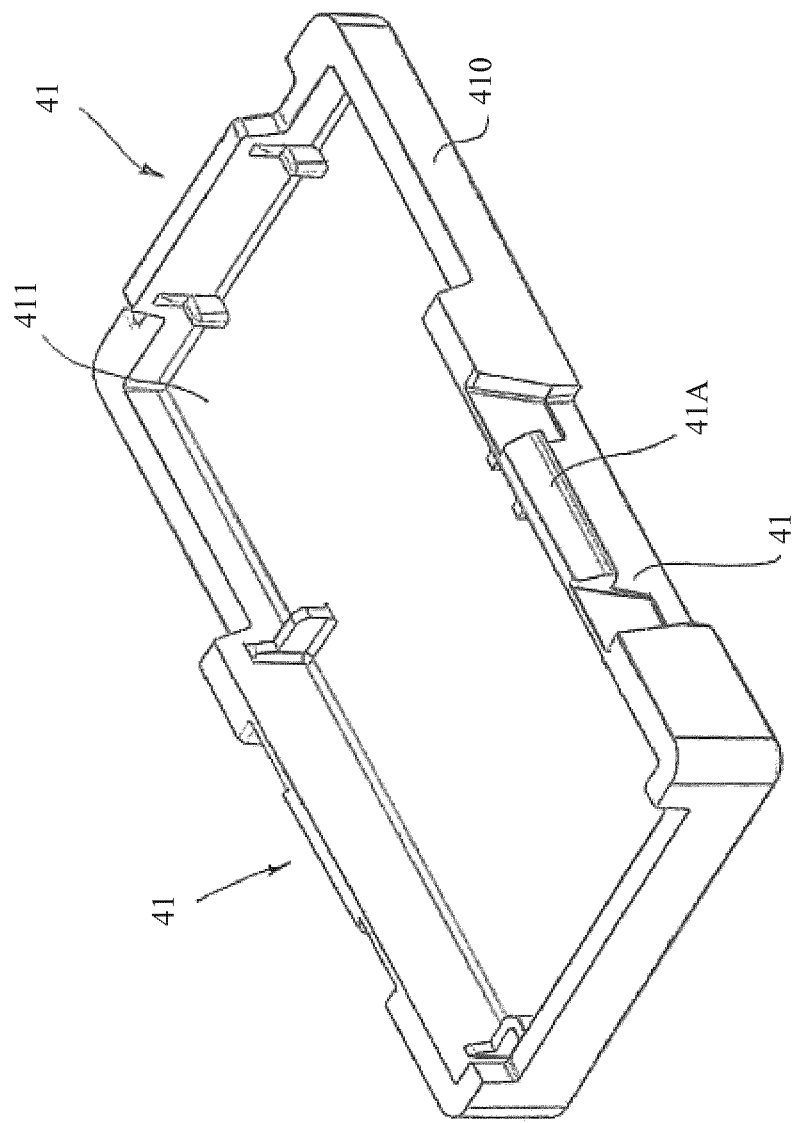

Preferably, the sides 2B, 2C are substantially perpendicular to the sides 2A, 2D (FIGS. 1-2).

Preferably, the casing 2 comprises a top side 2E and a bottom side 2F opposite one to another. The sides 2A-2F of the casing 2 are formed by the top shell 3 and the bottom shell 4 when they are coupled together.

To this aim, the top shell 3 and the bottom shell 4 respectively comprise contoured first sidewalls 310 and second sidewalls 410 that are coupleable to form sides 2A-2D of the casing 2.

The top shell 3 comprises a top wall 311 forming the top side 2E whereas the bottom shell 4 comprises a base wall 411 forming the bottom side 2F.

The accessory device 1 comprises electronic means 20 positioned within the internal volume 50 of the casing 2.

The electronic means 20 comprise one or more current sensors 22A, 22B configured to detect a current flowing in an electric cable 100, which has to be operatively associated to the accessory device 1.

The current sensors 22A, 22B are advantageously adapted to provide detection signals indicative of the current flowing in the electric cable 100.

The current sensors 22A, 22B are advantageously adapted to perform a proximity detection of the current flowing along the electric cable 100.

In other words, they are configured to detect a physical quantity (e.g. a magnetic field) in a point located in the nearby of the electric cable 100 to provide the aforesaid detection signals.

Preferably, the current sensors 22A, 22B are Hall sensors.

Preferably, the current sensors 22A, 22B are positioned in the proximity of the side 2A of the casing 2.

Preferably, the electronic means 20 comprise an electronic circuitry 24, which may include one or more digital processing devices.

Preferably, the electronic circuitry 24 comprises one or more interface circuits operatively connected with the current sensors 22A, 22B to process the detection signals provided by these latter.

Preferably, the electronic means 20 comprise a support board 23 having opposite first and second mounting surfaces 23A, 23B, on which the sensors 22A, 22B and the electronic circuitry 24 are operatively mounted.

According to an aspect of the invention, the accessory device 1 comprises one or more connection elements 26, 27 adapted to provide an electrical connection with the electronic means 20.

The connection elements 26, 27 may be adapted to connect the accessory device 1 with an auxiliary power supply or with an external electronic device for communication purposes.

Preferably, the connection elements 26, 27 are operatively connected with the electronic circuitry 24.

Preferably, the connection elements 26, 27 are positioned in the proximity of the side 2D of the casing 2.

The top shell 3 comprises an external recess 32 positioned in proximity of the current sensors 22A, 22B (e.g. in proximity of the side 2A of the casing 2 as shown in the cited figures).

The recess 32 has a bottom wall 325, first lateral walls 321 opposite one to another and second lateral walls 322 opposite one to another.

Preferably, the recess 32 is substantially configured as a parallelepiped-shaped blind cavity.

The recess 32 comprises a cable seat 326 for accommodating the electric cable 100.

The cable seat 326 is defined by the bottom wall 325 and the lateral walls 321.

The cable seat 326 is shaped so that the electric cable 100 is accommodated in a transversal position (preferably a perpendicular position) with respect to the casing 2, more particularly with respect to the lateral walls 321.

The cable seat 326 is positioned in proximity of the current sensors 22A, 22B.

Preferably, the cable seat 326 is arranged in such a way that the electric cable 100 is overlapped with the current sensors 22A, 22B, when it is accommodated therein.

Preferably, the cable seat 326 is U-shaped at the lateral walls 321 so as to favour the insertion and the positioning of the electric cable 100.

Preferably, the cable seat 326 is oriented in such a way that the electric cable 100 is positioned substantially parallel to the side 2A and substantially perpendicular to the sides 2B, 2C of the casing 2, when it is inserted in said cable seat.

The cable seat 326 has a cable coupling surface 327, which is adapted to mechanically couple with the electrical cable 100, when this latter is accommodated therein.

Preferably, the cable coupling surface 327 is shaped like a circle arc.

Preferably, the radius of the cable coupling surface 327 is advantageously selected as a function of the maximum diameter foreseen for the electric cables to be coupled with the accessory device 1.

According to an aspect of the invention, the casing 2 comprises a first window 329 accessing the internal volume 50.

Preferably, the first window 329 passes through the thickness of the top shell 3 at the bottom wall 325 of the external recess 32.

Preferably, the first window 329 is positioned at the cable seat 326 and is overlapped, at least partially, with the current sensors 22A, 22B.

The electric cable 100 is at least partially overlapped with the first window 329, when it is accommodated in the cable seat 326.

In this way, the cable 100 can be overlapped with the current sensors 22A, 22B without having any intermediate material therebetween.

It has been proven such a solution improves the accuracy of the current measurements performed by accessory device 1.

The accessory device 1 comprises a holder element 6 mechanically coupleable with the top shell 3 in the external recess 32.

Preferably, the holder element 6 has a parallelepiped body shaped so as to suitably fit with the external recess 32 and be accommodated therein.

In particular, the holder element 6 preferably comprises:
first and second coupling sides 6A, 6B that are opposite one to another. Each of them may be faced with the bottom wall 325 of the recess 32 when the holder element 6 is accommodated in the recess 32;
third coupling sides 6C that are opposite one to another. Each of them faces a corresponding first lateral wall 321 of the recess 32 when the holder element 6 is accommodated in the recess 32;
fourth coupling sides 6D that are opposite one to another. Each of them faces a corresponding second lateral wall 322 of the recess 32 when the holder element 6 is accommodated in the recess 32.

The holder element 6 comprises one or more holding surfaces 61, 62, 63, 64.

According to an aspect of the invention, the holder element 6 comprises a plurality of holding surfaces.

In the embodiment shown in the cited figures, the holder element 6 comprises four holding surfaces 61, 62, 63, 64.

However, a different number of holding surfaces may be adopted according to the needs.

Preferably, the holding surfaces 61, 62, 63, 64 are positioned at one or more of the coupling sides 6A, 6B of the holder element 6.

The holding surfaces 61, 62, 63, 64 may be positioned at one of or both the coupling sides 6A, 6B.

In the embodiment shown in the cited figures, the holder element 6 comprises two holding surfaces 61, 62 at the coupling side 6A and two holding surfaces 63, 64 at the coupling side 6B.

However, a different arrangement of the holding surfaces 61, 62, 63, 64 on the coupling sides 6A, 6B may be adopted according to the needs.

Preferably, the holding surfaces 61, 62, 63, 64 extend along main extension directions that are substantially perpendicular to the coupling sides 6C and parallel to the coupling sides 6D of the holder element 6.

Each holding surface 61, 62, 63, 64 is shaped for mechanically coupling with an electric cable of a given corresponding size.

For the sake of clarity, it is specified that the term "size" may refer to any quantity characterising the thickness of the electric cable, such as the external diameter of the electric cable or the useful section for the current flow in the electric cable or a range of values for said external diameter or useful section.

Thus, when it is stated that the electric cable has a given size, it is here intended that it has a given external diameter or useful section or it has an external diameter or useful section comprised in a given range of values.

Preferably, each holding surface 61, 62, 63, 64 is shaped like a circle arc.

Preferably, the radius of each holding surface 61, 62, 63, 64 is advantageously selected as a function of the size foreseen for the electric cables adapted to be coupled with said holding surface.

In the embodiment shown in the cited figures, the radiuses of the holding surfaces 61, 62, 63, 64 have been selected as a function of corresponding four different sizes foreseen for the electric cables to be coupled with the accessory device.

Preferably, the holder element 6 comprises one or more blind cavities 65 formed for weight reduction purposes.

In this case, as shown in the cited figures, each holding surface 61, 62, 63, 64 may comprise a plurality of surface portions arranged along a corresponding main extension direction separated by intermediate gaps.

The holder element 6 can be accommodated in the recess 32 in one or more accommodating positions A, B, C, D.

Each accommodating position A, B, C, D is selectable depending on the size of the electric cable 100 to be coupled with the accessory device 1.

Each holding surface 61, 62, 63, 64 is overlapped and mechanically coupled with the electric cable 100, when the holder element 6 is positioned in the recess 32 in a corresponding accommodating position A, B, C, D.

Each holding surface 61, 62, 63, 64, when it is overlapped and coupled with the electric cable 100, cooperates with the cable coupling surface 327 of the cable seat 326 to hold the electric cable 100 in a given position relative to the current sensors 22A, 22B.

Figure 10:
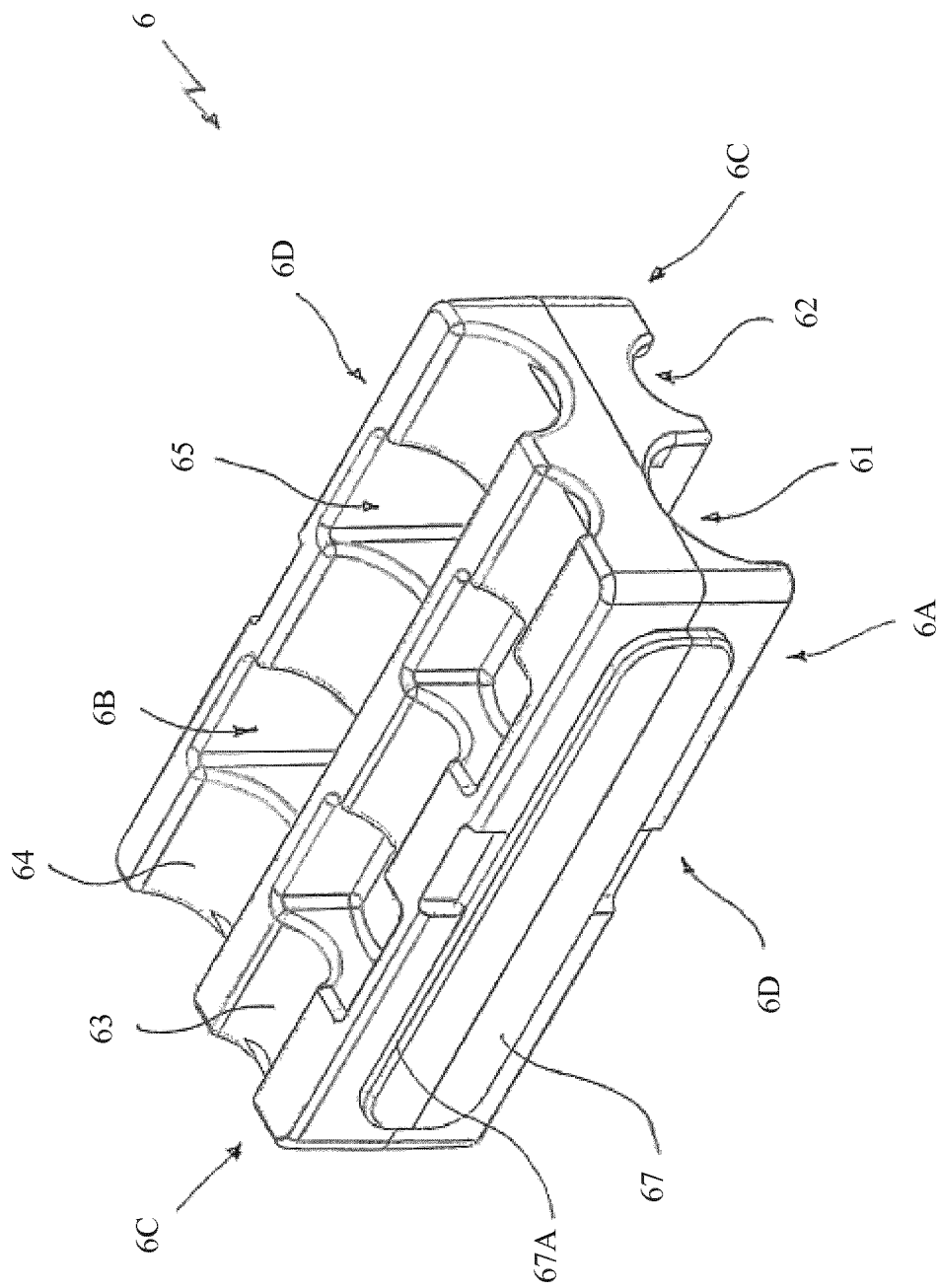
FIGS. 10-11 show different views of the holder element of the accessory device of FIGS. 1-3.
Figure 11:
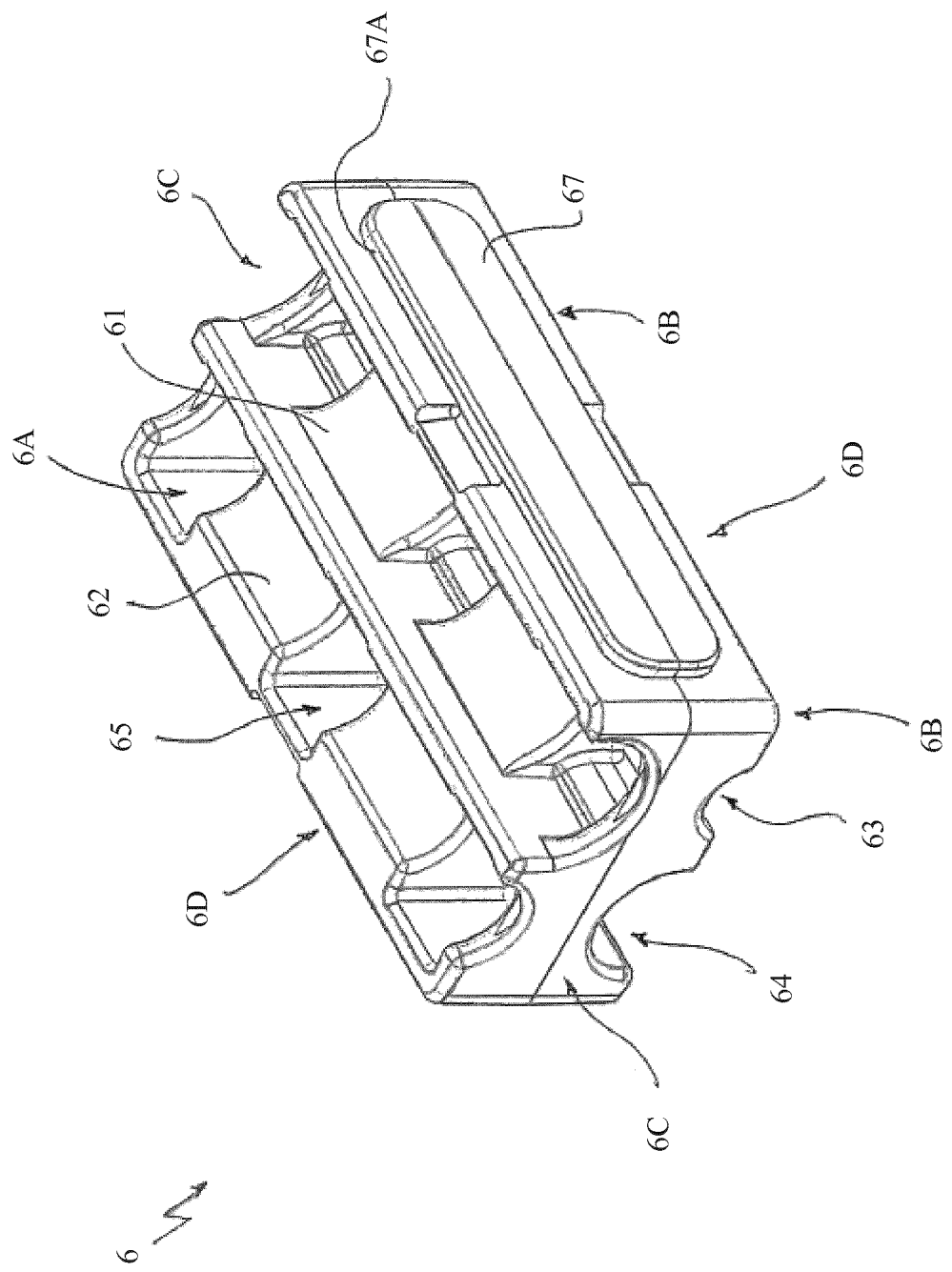
Figure 12:
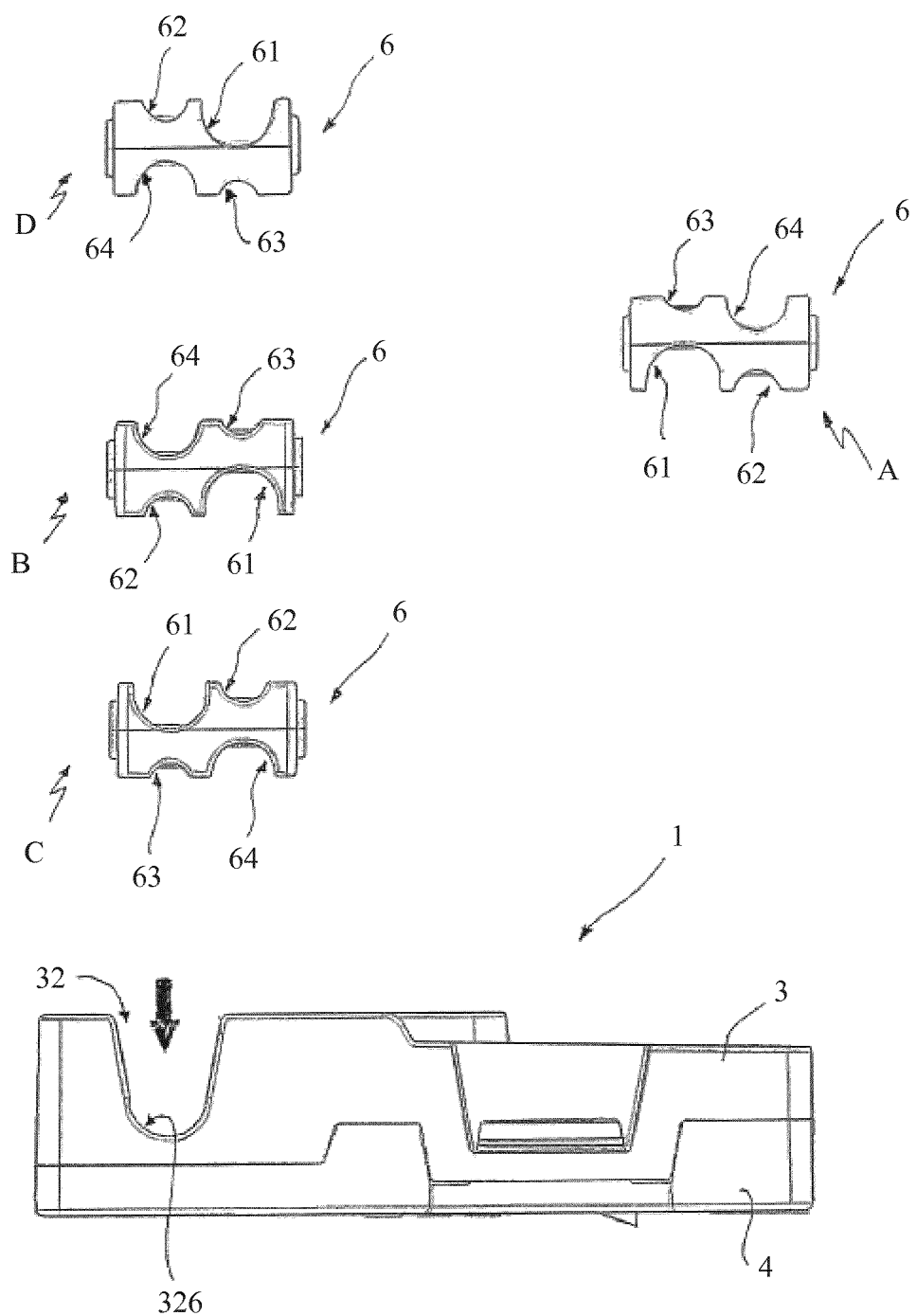
FIG. 12 shows some possible operating positions of said holder element.

Referring to the embodiment shown in the cited figures, characteristics and functions of the holder element 6 are now described in more details (FIGS. 10-12).

Preferably, the holder element 6 comprises a first holding surface 61 at the coupling side 6A, which is shaped so as to couple with an electric cable 100 having a corresponding first size (e.g. 10 mm$^2$ of useful section for the current flow).

Preferably, the holder element 6 comprises a second holding surface 62 at the coupling side 6A, which is shaped so as to couple with an electric cable 100 having a corresponding second size (e.g. 4 mm$^2$ of useful section for the current flow).

Preferably, the holder element 6 comprises a third holding surface 63 at the coupling side 6B, which is shaped so as to couple with an electric cable 100 having a corresponding third size (e.g. 2.5 or 1.5 mm$^2$ of useful section for the current flow).

Preferably, the holder element 6 comprises a fourth holding surface 64 at the coupling side 6B, which is shaped so as to couple with an electric cable 100 having a corresponding fourth size (e.g. 6 mm$^2$ of useful section for the current flow).

When it has to be coupled with the accessory device 1, the electric cable 100 is accommodated in the cable seat 326 so as to couple with the cable coupling surface 327.

When the electric cable 100 has the mentioned first size, the holder element 6 is positioned in the external recess 32 in a first accommodating position A, which corresponds to said first size. In this case, the holder element 6 has the coupling side 6A facing the bottom wall 325 and is oriented in such a way that the holding surface 61 overlaps the electric cable 100. The holding surface 61 mechanically couples with the electric cable 100 and cooperates with the cable coupling surface 327 to hold the electric cable in the cable seat 326, where said electric cable is in a given position with respect to the current sensors 22A, 22B.

When the electric cable 100 has the mentioned second size, the holder element 6 is positioned in the external recess 32 in a second accommodating position B, which corresponds to said second size. In this case, the holder element 6 has the coupling side 6A facing the bottom wall 325 and is oriented in such a way that the holding surface 62 overlaps the electric cable 100. The holding surface 62 mechanically couples with the electric cable 100 and cooperates with the cable coupling surface 327 to hold the electric cable in the cable seat 326.

When the electric cable 100 has the mentioned third size, the holder element 6 is positioned in the external recess 32 in a third accommodating position C, which corresponds to said third size. In this case, the holder element 6 has the coupling side 6B facing the bottom wall 325 and is oriented in such a way that the holding surface 63 overlaps the electric cable 100. The holding surface 63 mechanically couples with the electric cable 100 and cooperates with the cable coupling surface 327 to hold the electric cable in the cable seat 326.

When the electric cable 100 has the mentioned fourth size, the holder element 6 is positioned in the external recess 32 in a fourth accommodating position D, which corresponds to said third size. In this case, the holder element 6 has the coupling side 6B facing the bottom wall 325 and is oriented in such a way that the holding surface 64 overlaps the electric cable 100.

The holding surface 64 mechanically couples with the electric cable 100 and cooperates with the cable coupling surface 327 to hold the electric cable in the cable seat 326.

From the above, it is apparent that the holder element 6 can be accommodated in the recess 32 in an accommodating position A, B, C, D that is selectable depending on the size of the electric cable 100.

At each selected accommodating position A, B, C, D, a corresponding holding surface 61, 62, 63, 64 of the holder element 6, which is suitably shaped to couple with electric cables of said corresponding size, mechanically couples with the electric cable 100 and cooperates with the cable coupling surface 327 to hold the electric cable 100 in the cable seat 326.

A same holder element 6 can thus be used to ensure a stable coupling of the accessory device 1 with electric cables having different sizes.

However, in line of principle, the holder element 6 may comprise a single holding surface, which is obviously obtained at only one of the coupling sides 6A, 6B.

In this case, the holder element 6 can be accommodated in one accommodating positing only to couple said holding surface with the electric cable 100.

The holder element 6 can thus be used to ensure coupling of the accessory device 1 with electric cables 100 of a given size only.

In this case, the accessory device 1 may comprise a plurality of holder elements 6, each of which is adapted to ensure coupling of the accessory device 1 with electric cables of a different size.

According to an aspect of the invention, the holder element 6 is coupleable in a movable manner with the top shell 3 at the external recess 32.

Preferably, in order to ensure a stable positioning of the holder element 6 within the recess 32, the top shell 3 comprises first connection means 328, 328A that are adapted to be snap-fit connected with corresponding second connection means 67, 67A of the holder element 6.

Preferably, said first connection means comprise a pair of flexible wings 328 protruding perpendicularly from the bottom wall 325 of the recess 32.

Preferably, the flexible wings 328 are positioned substantially parallel with respect to the second lateral walls 322 of the recess 32.

Preferably, the flexible wings 328 are laterally positioned with respect to the cable seat 326, at symmetric opposite positions that are differently spaced from said cable seat.

Preferably, said second connection means comprise a pair of side protrusions 67 of the holder element 6.

Preferably, the side protrusions 67 are positioned at the fourth coupling sides 6D of the holder element 6.

Preferably, each flexible wing 328 has a free-standing engaging end 328A, which is adapted to engage with an engaging surface 67A of a corresponding side protrusion 67, when the holder element 6 is accommodated in the recess 32 in a given accommodating position.

When the holder element 6 is inserted in the recess 32, each flexible wing 328 is subject to a slight deformation that allows the engaging end 328A to couple with the corresponding engaging surface 67A of a side protrusion 67.

According to an aspect of the invention, the top shell 3 is coupleable in a removable manner with the bottom shell 4.

Preferably, in order to ensure the mutual coupling between the bottom shell 4 and the top shell 3, the bottom shell 4 comprises third connection means 41, 41A that are adapted to be snap-fit connected with corresponding fourth connection means 301, 301A, 301B of the top shell 3.

Preferably, the aforesaid third and fourth connection means are positioned at the three sides 2A, 2B, 2C of the casing 2.

Preferably, said third connection means comprise a plurality of first connection portions 41 of the bottom shell 4 at corresponding sidewalls 410 of this latter.

Preferably, each first connection portion 41 of the bottom shell 4 has a protruding edge 41A.

Preferably, said fourth connection means comprise a plurality of second connection portions 301 of the top shell 3 at corresponding lateral walls 310 of this latter.

Preferably, the second connection portions 301 of the top shell 3 comprise connection edges 301B, which at least partially define corresponding connection apertures 301A.

Preferably, when the top shell 3 and the bottom shell 4, the protruding edge 41A of each connection portion 41 of the bottom shell 4 is adapted to be inserted in the connection aperture 301A of a corresponding second connection portion 301 of the top shell 3.

When the protruding edge 41A is inserted in the corresponding connection aperture 301A, the connection portion 301 is subject to a slight deformation, which allows the protruding edge 41A to engage the connection edge 301B.

According to an aspect of the invention, the casing 2 comprises a second window 35 accessing the internal volume 50.

The second window 35 passes through the thickness of the top shell 3 (namely of the top wall 311 thereof) at the top side 2E of the casing 2, preferably out of the recess 32 and in proximity of the fourth side 2D.

Advantageously, the second window 35 accommodates at least partially the first connection element 26 of the accessory device, which provides an electrical connection with the electronic means 20.

According to an aspect of the invention, the casing 2 comprises a third window 37 accessing the internal volume 50.

The third window 37 passes through the thickness of the casing 2 at the fourth side 2D.

The third window 37 is advantageously formed by contoured portions of the sidewalls 310, 410 of the top shell 3 and of the bottom shell 4, when these latter are coupled together.

Advantageously, the third window 37 accommodates at least partially the second connection element 27 of the accessory device, which provides an electrical connection with the electronic means 20.

According to an aspect of the invention, the electronic means 20 comprise a first current sensor 22A and a second current sensor 22B positioned respectively on said the first mounting surface 23A and on the second mounting surface 23B of the support board 23.

Preferably, the current sensors 23A, 23B are mounted at symmetric mounting positions with respect to a reference plane defined by the support board 23 (FIG. 13).

When the electric cable 100 is accommodated in the cable seat 326, the first and second current sensors 22A, 22B are respectively in a proximal position and in a distal position with respect to said electric cable.

Both the sensors 22A, 22B provide detection signals to the electronic circuitry 24, which are indicative of the current passing through the electric cable 100.

The electronic circuitry 24 is advantageously configured to disregard (e.g. by suitable filtering) the detection signals provided by the current sensor 22A, when high currents pass through the electric cable 100.

In fact, when high currents are present, the detection signals provided by the current sensor 22A may be subject to errors caused by saturation phenomena, as the current sensor 22A is located at a shorter distance from the electric cable 100.

The electronic circuitry 24 is advantageously configured to disregard the detection signals provided by the current sensor 22B, when small currents pass through the electric cable 100.

In fact, when small currents are present, the detection signals provided by the current sensor 22B may be subject to errors caused by noise phenomena, as the current sensor 22B is located at a longer distance from the electric cable 100.

It has been observed that the solution above allows remarkably increasing the accuracy of the current measurements performed by the accessory device.

In general, the casing 2 may be made of electric insulating material, such as a plastic material (e.g. polyamide compounds).

According to an aspect of the invention, one or more portions of the accessory device 1, such as the top shell 3 and/or the bottom shell 4 and/or the holder element 6 or parts thereof, are realized in material providing electromagnetic and radio frequency interference attenuation in order to further increase the accuracy of the current measurements performed by accessory device.

Suitable compounds of polyamide and stainless steel powders (or fibers) or any other compounds of plastic materials and proper fillers may be used to provide such an electromagnetic shielding effect.

The accessory 1 may be implemented according to possible alternative embodiments with respect to those described above. Such possible variants are considered within the scope of the invention.

As an example, the electronic means may comprise a single current sensor to provide detection signals indicative of the current flowing along the electric cable 100.

Alternative connection means may be used to operatively couple in a stable manner the holder element 6 with the top shell 3 at the external recess 32.

Further alternative connection means may be adopted to operatively couple the bottom shell 4 and the top shell 3.

The holder element 6 may comprise a single holding surface or a different number of holding surfaces with respect to the embodiments described above.

The holding surfaces may be differently distributed on the coupling sides 6A, 6B of the holder element 6 with respect to the embodiments described above.

The holding surfaces may relate to different cable sizes with respect to the embodiments described above.

The accessory device 1 provides remarkable advantages with respect to the solutions of the state of the art.

The accessory device 1 may be operatively associated in a stable and repeatable manner with electric cables of different size.

In this way, the accuracy of the current measurements are not affected by the size of the electric cable and by the ability of the operator in fixing said electric cable to the casing of the accessory device.

The accessory device 1 thus ensures improved measurement accuracy with respect to solutions of the state of the art.

For example, it has been proven that the accessory device 1 can perform current measurements with errors constantly lower than 5%.

The accessory device 1 can be easy assembled and operatively installed with simple click and go operations.

The accessory device 1 has a very compact structure with a reduce size with respect to the solutions of the state of the art.

The accessory device 1 has proven to be of relatively easy and cheap realization at industrial level and of practical installation on the field.

The invention claimed is:

1. An accessory device for low and medium voltage electric equipment, comprising:
a casing comprising a top shell and a bottom shell that are mechanically coupleable one to another to form a shaped box body defining an internal volume;
electronic means including one or more current sensors configured to detect a current flowing in an electric cable, said electronic means being positioned within the internal volume of said casing;
wherein said top shell comprises an external recess having a bottom wall, first lateral walls opposite one to another and second lateral walls opposite one to another, said bottom wall and said first lateral walls being shaped so as to define a cable seat for accommodating said electric cable in a transversal position with respect to said first lateral walls and in proximity of said current sensors, said cable seat having a cable coupling surface adapted to mechanically couple with said electrical cable;
a holder element mechanically coupleable with said top shell in said external recess and comprising a plurality of holding surfaces;
wherein each of said plurality of holding surfaces is overlapped and mechanically coupled with said electric cable, when said holder element is positioned in said external recess in a corresponding accommodating position that is selectable depending on the size of said electric cable,
wherein each of said plurality of holding surfaces, when overlapped and coupled with said electric cable, cooperates with said cable coupling surface to hold said electric cable in a given position with respect to said current sensors.

2. The accessory device, according to claim 1, wherein said plurality of holding surfaces includes a first holding surface that is coupled with said electric cable when said holder element is positioned in said external recess in a first accommodating position (A) corresponding to a first size of said electric cable.

3. The accessory device, according to claim 2, wherein said plurality of holding surfaces includes a second holding surface that is coupled with said electric cable when said holder element is positioned in said external recess in a second accommodating position (B) corresponding to a second size of said electric cable.

4. The accessory device, according to claim 3, wherein said plurality of holding surfaces includes a third holding surface, which is coupled with said electric cable when said holder element is positioned in said external recess in a third accommodating position (C) corresponding to a third size of said electric cable.

5. The accessory device, according to the claim 4, wherein said plurality of holding surfaces includes a fourth holding surface, which is coupled with said electric cable when said holder element is positioned in said external recess in a fourth accommodating position (D) corresponding to a fourth size of said electric cable.

6. The accessory device, according to claim 1, wherein said top shell comprises first connection means at said external recess, said first connection means being adapted to be snap-fit connected with corresponding second connection means of said holder element.

7. The accessory device, according to claim 6, wherein said bottom shell comprises third connection means adapted to be snap-fit connected with corresponding fourth connection means of said top shell.

8. The accessory device, according to claim 1, wherein said electronic means comprise a support board having opposite first and second mounting surfaces, said electronic means comprising a first current sensor and a second current sensor positioned respectively on said first mounting surface and on said second mounting surface, said first and second current sensors being respectively in a proximal position and distal position with respect to said electric cable, when said electric cable is accommodated in said cable seat.

9. The accessory device, according to the claim 8, wherein said electronic means comprise electronic circuitry operatively connected to said current sensors and configured to:
   process the detection signals provided by said second current sensor to detect the current flowing through the electric cable, when high currents flow along said electric cable; and
   process the detection signals provided by said first current sensor to detect the current flowing through the electric cable, when small currents flow along said electric cable.

10. The accessory device, according to claim 1, wherein said box shaped body includes first and fourth sides along respective ones of said second lateral walls of said top shell and said box shaped body includes second and third sides along respective ones of said first lateral walls of said top shell, and wherein said cable seat is oriented in such a way that said electric cable is positioned substantially parallel to said first side of said casing and substantially perpendicular to said second and said third side of said casing.

11. The accessory device, according to claim 1, wherein at least one of the top shell, the bottom shell, and the holder element is made in a material providing electromagnetic and radio frequency interference attenuation.

12. A low voltage or medium voltage electric power equipment that comprises an accessory device according to claim 1.

13. An accessory device for low and medium voltage electric equipment, comprising:
   a casing comprising a top shell and a bottom shell that are mechanically coupleable one to another to form a shaped box body defining an internal volume;
   electronic means including one or more current sensors configured to detect a current flowing in an electric cable, said electronic means being positioned within the internal volume of said casing;
   wherein said top shell comprises an external recess having a bottom wall, first lateral walls opposite one to another and second lateral walls opposite one to another, said bottom wall and said first lateral walls being shaped so as to define a cable seat for accommodating said electric cable in a transversal position with respect to said first lateral walls and in proximity of said current sensors, said cable seat having a cable coupling surface adapted to mechanically couple with said electrical cable;
   a holder element mechanically coupleable with said top shell in said external recess and comprising one or more holding surfaces;
   wherein each of said holding surfaces is overlapped and mechanically coupled with said electric cable, when said holder element is positioned in said external recess in a corresponding accommodating position that is selectable depending on the size of said electric cable,
   wherein each of said holding surfaces, when overlapped and coupled with said electric cable, cooperates with said cable coupling surface to hold said electric cable in a given position with respect to said current sensors, wherein said casing comprises a first window passing through a thickness of said top shell at said cable seat so as to be at least partially overlapped with said current sensors, said electric cable being at least partially overlapped with said first window when positioned at said cable seat.

14. The accessory device, according to claim 13, wherein said casing comprises a second window passing through the thickness of said top shell at a top side of said casing, said second window accommodating, at least partially, a first connection element of said accessory device, which is adapted to provide an electrical connection with said electronic means.

15. The accessory device, according to claim 14, wherein said casing comprises a third window passing through a side of said casing between said top shell and said bottom shell, said third window accommodating, at least partially, a second connection element of said accessory device, which is adapted to provide an electrical connection with said electronic means.

16. The accessory device, according to claim 13, wherein said holder element comprises a first holding surface that is coupled with said electric cable when said holder element is positioned in said external recess in a first accommodating position corresponding to a first size of said electric cable.

17. The accessory device, according to claim 16, wherein said holder element comprises a second holding surface that is coupled with said electric cable when said holder element is positioned in said external recess in a second accommodating position (B) corresponding to a second size of said electric cable.

18. The accessory device, according to claim 17, wherein said holder element comprises a third holding surface, which is coupled with said electric cable when said holder element is positioned in said external recess in a third accommodating position (C) corresponding to a third size of said electric cable.

19. The accessory device, according to claim 18, wherein said holder element comprises a fourth holding surface, which is coupled with said electric cable when said holder element is positioned in said external recess in a fourth accommodating position (D) corresponding to a fourth size of said electric cable.

\* \* \* \* \*